(12) United States Patent  
Abdo

(10) Patent No.: US 9,858,532 B2  
(45) Date of Patent: Jan. 2, 2018

(54) MULTIMODE JOSEPHSON PARAMETRIC CONVERTER: COUPLING JOSEPHSON RING MODULATOR TO METAMATERIAL

(71) Applicant: International Business Machines Corporation, Armonk, NY (US)

(72) Inventor: Baleegh Abdo, Carmel, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 141 days.

(21) Appl. No.: 14/871,477

(22) Filed: Sep. 30, 2015

(65) Prior Publication Data

US 2017/0091648 A1    Mar. 30, 2017

(51) Int. Cl.
- *H03H 3/00* (2006.01)
- *H03H 7/00* (2006.01)
- *H01P 1/20* (2006.01)
- *G06N 99/00* (2010.01)
- *H03H 7/01* (2006.01)

(52) U.S. Cl.
CPC .............. *G06N 99/002* (2013.01); *H03H 3/00* (2013.01); *H03H 7/004* (2013.01); *H03H 7/0115* (2013.01)

(58) Field of Classification Search
CPC .............. H03H 7/00; H03H 7/01; H03H 3/00
See application file for complete search history.

(56) References Cited

U.S. PATENT DOCUMENTS

| 5,105,166 A | 4/1992 | Tsukii et al. |
| 7,554,080 B2 | 5/2009 | Munro et al. |
| 8,154,340 B2 * | 4/2012 | Dupuy .................. H01P 1/2039 330/126 |
| 8,488,231 B2 | 7/2013 | Shimizu et al. |
| 8,817,254 B2 | 8/2014 | Santori et al. |
| 8,878,626 B2 | 11/2014 | Zmuidzinas et al. |
| 8,947,317 B2 * | 2/2015 | Ueda ....................... H01P 1/203 333/32 |
| 9,030,731 B2 | 5/2015 | Arahira |

(Continued)

FOREIGN PATENT DOCUMENTS

| CN | 101436713 A | 5/2009 |
| EP | 0430506 A2 | 6/1991 |
| JP | 03188705 A | 8/1991 |

OTHER PUBLICATIONS

Ovchinnikova et al., "Design and experimental study of superconducting left-handed transmission lines with tunable dispersion", Oct. 2013, Superconductor Science and Technology vol. 26 No. 11.*

(Continued)

*Primary Examiner* — Dean Takaoka  
*Assistant Examiner* — Alan Wong  
(74) *Attorney, Agent, or Firm* — Cantor Colburn LLP; Vazken Alexanian

(57) ABSTRACT

A technique relates to a microwave device. The microwave device includes a Josephson ring modulator, a first multimode resonator connected to the Josephson ring modulator, where the first multimode resonator is made of a first left-handed transmission line, and a second multimode resonator connected to the Josephson ring modulator, where the second multimode resonator is made of a second left-handed transmission line.

15 Claims, 6 Drawing Sheets

(56) References Cited

U.S. PATENT DOCUMENTS 9,548,742 B1 * 1/2017 Abdo .................. H03K 3/38
2014/0314419 A1 10/2014 Paik

OTHER PUBLICATIONS

A. Narla, et al., " Wireless Josephson amplifier," Applied Physics Letters, vol. 104, No. 232605, Jun. 12, 2014, pp. 1-5.
A. Poudel, et al.,"Quantum efficiency of a microwave photon detector based on a current-biased Josephson junction", Physical Review, vol. 86, Nov. 6, 2012, p. 1-4.
B. Abdo, "Incorporating Arrays of Josephson Junctions in a Josephson Junction Ring Modulator in a Joesephson Parametric Converter," U.S. Appl. No. 14/754,315, filed Jun. 29, 2015, pp. 1-25.
B. Abdo, "Joesephson-Coupled Resonator Amplifier (JRA)," U.S. Appl. No. 14,743,315, filed Jun. 29, 2015, pp. 1-31.
B. Abdo, et al.,"Full Coherent Frequency Conversion between Two Propagating Microwave Modes," Physical Review Letters, vol. 110, No. 17, Apr. 26, 2013, pp. 1-5.
B. Abdo, et al.,"Josephson amplifier for qubit readout," Applied Physics Letters, vol. 99, No. 162506, Oct. 18, 2011, pp. 1-3.
B.Abdo, et al.,"Nondegenerate three-wave mixing with the Josephson ring modulator," Physical Review B, vol. 87, No. 014508, Jan. 16, 2013, pp. 1-18.
Baleegh Abdo, "Multimode Josephson Parametric Converter: Coupling Josephson Ring Modulator to Metamaterial" U.S. Appl. No. 14/952,117, filed Nov. 25, 2015.
Baleegh Abdo, "Multimode Josephson Parametric Converter: Coupling Josephson Ring Modulator to Metamaterial" U.S. Appl. No. 14/871,562, filed Sep. 30, 2015.
C. K. Andersen, et al.,"Quantized resonator field coupled to a current-biased Josephson junction in circuit QED", Physical Review, vol. 89, Mar. 27, 2014, p. 1-9.
E. Flurin, et al."Generating Entangled Microwave Radiation Over Two Transmission Lines", Physical Review Letters, Prl. 109, Oct. 31, 2012, p. 1-5.
G. Kirchmair, et al.,"Observation of quantum state collapse and revival due to the single-photon Kerr effect", Nature, vol. 495, Mar. 14, 2013, p. 1-5.
J Bourassa, et al.,"Josephson junction-embedded transmission-line resonators: from Kerr medium to in-line transmon", arXiv, vol. 2, Jul. 17, 2012, p. 1-15.
L. C. G. Govia, et al.,"High-fidelity qubit measurement with a microwave-photon counter", Physical Review, vol. 90, Dec. 2, 2014, p. 1-12.
List of IBM Patents or Patent Applications Treated as Related; Date Filed Sep. 30, 2015, p. 1-2.
M. Hartrige, et al.,"Quantum Back-Action of an Individual Variable-Strength Measurement", Reports, Science Magazine, vol. 339, Jan. 11, 2013, p. 1-5.
M. Simoen, et al.,"Characterization of a multimode coplanar waveguide parametric amplifier," arXiv preprint, arXiv, No. 1409.8160, vol. 2, Sep. 30, 2014, pp. 1-8.
N. Bergeal, et al.,"Analog information processing at the quantum limit with a Josephson ring modulator", Nature Physics, Articles, Feb. 14, 2010, p. 1-7.
N. Bergeal, et al.,"Phase-preserving amplification near the quantum limit with a Josephson ring modulator," Nature, vol. 465, May 6, 2010, pp. 1-6.
N. Bergeal, et al.,"Two-Mode Correlation of Microwave Quantum Noise Generated by Parametric Down-Conversion", Physical Review Letters, Mar. 21, 2012, p. 1-5.
N. Roch, et al.,"Widely Tunable, Nondegenerate Three-Wave Mixing Microwave Device Operating near the Quantum Limit," Physical Review Letters, vol. 108, No. 147701, Apr. 6, 2012, pp. 1-5.
O. Suchoi, et al.,"Intermode dephasing in a superconducting stripline resonator", Physical Review, vol. 81, May 24, 2010, p. 1-8.
International Search Report and Written Opinion, International Application No. PCT/IB2016/055741; International Filing date Sep. 26, 2016; dated Jan. 12, 2017; pp. 1-11.
Baleegh Abdo, "Multimode Josephson Parametric Converter: Coupling Josephson Ring Modulator to Metamaterial" U.S. Appl. No. 15/443,120, filed Feb. 27, 2017.
Baleegh Abdo, "Multimode Josephson Parametric Converter: Coupling Josephson Ring Modulator to Metamaterial" U.S. Appl. No. 15/443,137, filed Feb. 27, 2017.

* cited by examiner

US 9,858,532 B2

MULTIMODE JOSEPHSON PARAMETRIC CONVERTER: COUPLING JOSEPHSON RING MODULATOR TO METAMATERIAL

BACKGROUND

The present invention relates to quantum information processing in the microwave domain using superconducting circuits, and more specifically, to a multimode Josephson parametric converter.

Recent progress in solid-state quantum information processing has stimulated the search for amplifiers and frequency converters with quantum-limited performance in the microwave domain. Depending on the gain applied to the quadratures of a single spatial and temporal mode of the electromagnetic field, linear amplifiers can be classified into two categories (phase sensitive and phase preserving) with fundamentally different noise properties. Phase-sensitive amplifiers squeeze the input noise and signal in one quadrature of the microwave field at the expense of inflating the noise and signal in the other quadrature without adding noise of their own to the processed signal, but are useful only in cases in which the quantum information is encoded in one quadrature of the microwave field. A phase-preserving amplifier on the other hand amplifies both quadratures of the input noise and signal at the expense of adding at least a noise equivalent to a half input photon at the signal frequency. Such an amplifier would be useful in many quantum applications, including qubit readout. One successful realization of a non-degenerate-intrinsically phase-preserving-superconducting parametric amplifier is based on a Josephson ring modulator, which consists of four Josephson junctions in a Wheatstone bridge configuration. The device symmetry enhances the purity of the amplification process, i.e., eliminates or minimizes certain undesired nonlinear processes, and also simplifies both its operation and its analysis.

SUMMARY

According to one embodiment, a microwave apparatus is provided. The microwave apparatus includes a Josephson ring modulator, a first multimode resonator connected to the Josephson ring modulator, where the first multimode resonator is made of a first left-handed transmission line, and a second multimode resonator connected to the Josephson ring modulator, where the second multimode resonator is made of a second left-handed transmission line.

According to one embodiment, a method of configuring a microwave apparatus is provided. The method includes connecting a first multimode resonator to a Josephson ring modulator, where the first multimode resonator is made of a first left-handed transmission line, and connecting a second multimode resonator to the Josephson ring modulator, where the second multimode resonator is made of a second left-handed transmission line.

According to one embodiment, a microwave apparatus is provided. The microwave apparatus includes a Josephson ring modulator in a Wheatstone bridge configuration, where the Josephson ring modulator include a first pair of nodes opposite one another and a second pair of nodes opposite one another, and a first multimode resonator connected to the Josephson ring modulator, where the first multimode resonator is a first left-handed transmission line. The first multimode resonator is connected to the first pair of nodes, and the first multimode resonator includes first unit cells. Also, the microwave apparatus includes a second multimode resonator connected to the Josephson ring modulator, where the second multimode resonator is a second left-handed transmission line. The second multimode resonator is connected to the second pair of nodes, and the second multimode resonator includes second unit cells. A ground plane is connected to inductors respectively in the first unit cells and the second unit cells, and capacitors connect to another end of the inductors respectively in the first unit cells and the second unit cells.

According to one embodiment, a microwave apparatus is provided. The microwave apparatus includes a Josephson ring modulator in a Wheatstone bridge configuration, where the Josephson ring modulator includes a first pair of nodes opposite one another and a second pair of nodes opposite one another, and a first multimode resonator connected to the Josephson ring modulator, where the first multimode resonator is a first left-handed transmission line. A lumped-element side of the first multimode resonator is connected to one node in the first pair of nodes and a conducting plane is connected to another node in the first pair of nodes. The first multimode resonator includes first unit cells. Also, the microwave apparatus includes a second multimode resonator connected to the Josephson ring modulator, where the second multimode resonator is a second left-handed transmission line. A lumped-element side of the second multimode resonator is connected to one node in the second pair of nodes, and a conducting plane is connected to another node in the second pair of nodes. The second multimode resonator includes second unit cells.

DETAILED DESCRIPTION

Embodiments disclose a quantum device based on the Josephson ring modulator suitable for quantum information processing. The quantum device includes a Josephson ring modulator coupled to multimode resonators implemented using metamaterial/left-handed transmission lines, thereby forming a multimode Josephson parametric converter.

Figure 1:
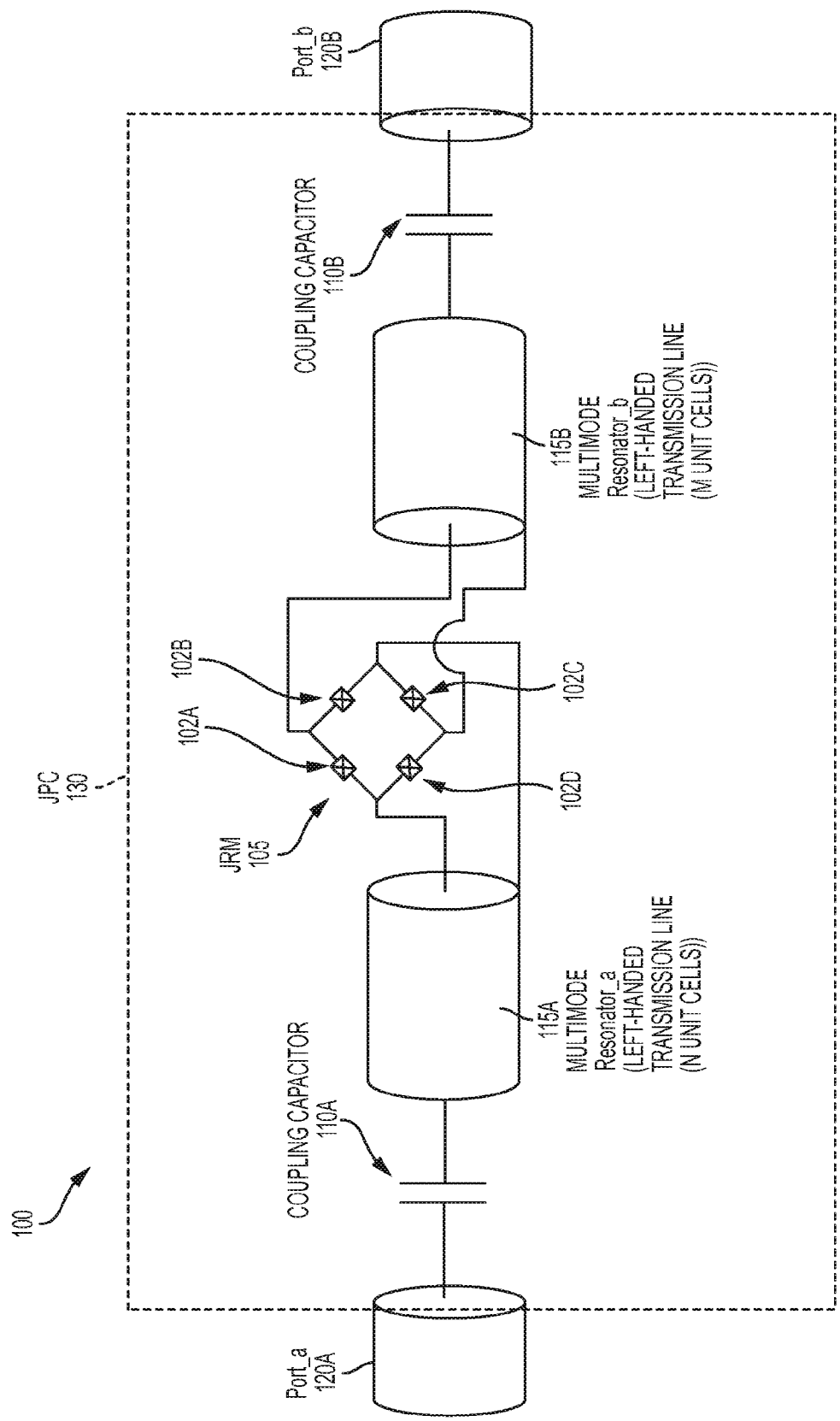
FIG. 1 is a high-level schematic of a quantum microwave device according to an embodiment.

FIG. 1 is a high-level schematic of a quantum microwave device 100 according to an embodiment. The quantum device 100 includes a multimode Josephson ring modulator (JRM) 105 which is a nonlinear dispersive element based on Josephson tunnel junctions 102A, 102B, 102C, and 102D that can perform three-wave mixing of microwave signals at the quantum limit. The JRM 105 consists of four nominally identical Josephson junctions 102A-102D arranged in a Wheatstone bridge configuration. In order to construct a non-degenerate parametric device that is the multimode Josephson parametric converter (JPC) 130, which is capable of amplifying and/or mixing microwave signals at the quantum limit, the JRM 105 is incorporated into two multimode microwave resonators at a radio frequency (RF) current anti-node of the multiple of their eigenmodes.

One of the multimode microwave resonators is multimode resonator_a 115A and the other is multimode resonator_b 115B. The multimode resonator_a 115A is a left-handed transmission line with N unit cells, and the multimode resonator_b 115B is a left-handed transmission line with M unit cells as discussed further below. A coupling capacitor 110A connects the multimode resonator_a 115A to port_a 120A while the coupling capacitor 110B connects the multimode resonator_b 115B to port_b 120B. The multimode JPC 130 includes both the multimode resonator_a 115A and multimode resonator_b 115B, along with the JRM 105.

The performances (namely power gain G, dynamical bandwidth y, and maximum input power $P_{max}$) of the multimode JPC 130 are strongly dependent on the critical current $I_0$ of the Josephson junctions 102A-102D of the JRM 105, the specific realization of the electromagnetic environment (i.e., the microwave multimode resonator_a 115A and microwave multimode resonator_b 115B), the coupling between the JRM 105 and the multimode resonators 115A and 115B, and the coupling between the multimode resonators to the feedlines.

The port_a 120A and/or port_b 120B may be microwave coaxial lines or waveguides. Although not shown, other devices connected to the quantum device 100 may include hybrids, attenuators, circulators, isolators, lowpass microwave filters, bandpass microwave filters, infrared filters, and qubit-cavity systems.

Figure 2:
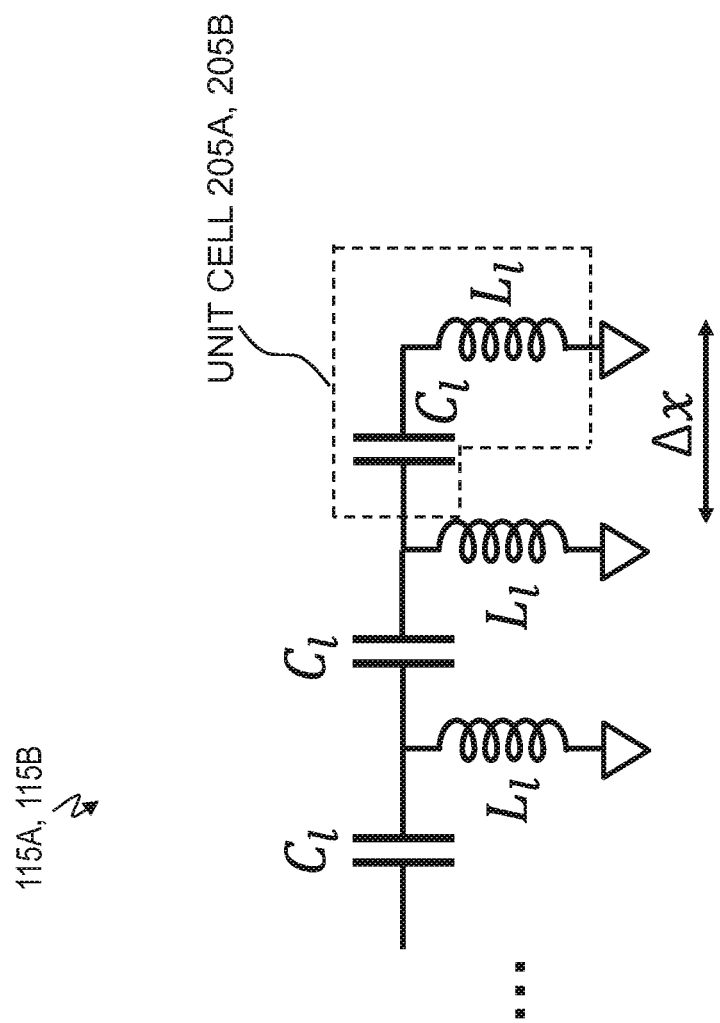
FIG. 2 is a circuit representation of a semi-infinite lossless left-handed transmission line utilized in the multimode microwave resonators of a multimode Josephson parametric converter according to an embodiment.

FIG. 2 is a circuit of a semi-infinite lossless left-handed transmission line which may be utilized in the construction of the multimode microwave resonator_a 115A and the multimode microwave resonator_b 115B according to an embodiment. The unit cell, e.g., unit cell 205A for microwave multimode resonator_a 115A and unit cell 205B for microwave multimode resonator_b 115B, includes a capacitor $C_1$ connected to inductor $L_1$ where "1" represent left-handed transmission line. The other end of the inductor $L_1$ is connected to ground. The unit cell 205A, 205B is connected to another unit cell, which is connected to another unit cell, and so forth. The unit cell 205A is repeated N amount of times for the multimode resonator_a 115A, and the unit cell 205B is repeated M amount of times for the multimode resonator_b 115B, as shown further below.

The dispersion relation of a left-handed transmission line reads $$\omega_l(k_l) = \frac{1}{2\sqrt{L_l C_l} \sin\left(\frac{k_l \Delta x}{2}\right)}$$

where $\Delta x$ is the size of the unit cell, and $k_l$ is the wave vector.

The phase and group velocity of the left-handed transmission line have opposite orientation $$\frac{\partial w_l(k)}{\partial k} < 0,$$

where k is $k_l$. One consequence of this relation is that in left-handed transmission lines low-frequencies correspond to short wavelengths. In contrast, in right-handed transmission lines where the dispersion relation increases with the wave vector, low-frequencies correspond to long wavelengths.

The characteristic impedance of the left-handed transmission line is $$Z_l = \sqrt{\frac{L_l}{C_l}}.$$

Low-frequency bound of the left-handed transmission line is $$\omega_{IR} = \frac{1}{2\sqrt{L_l C_l}}.$$

Figure 3:
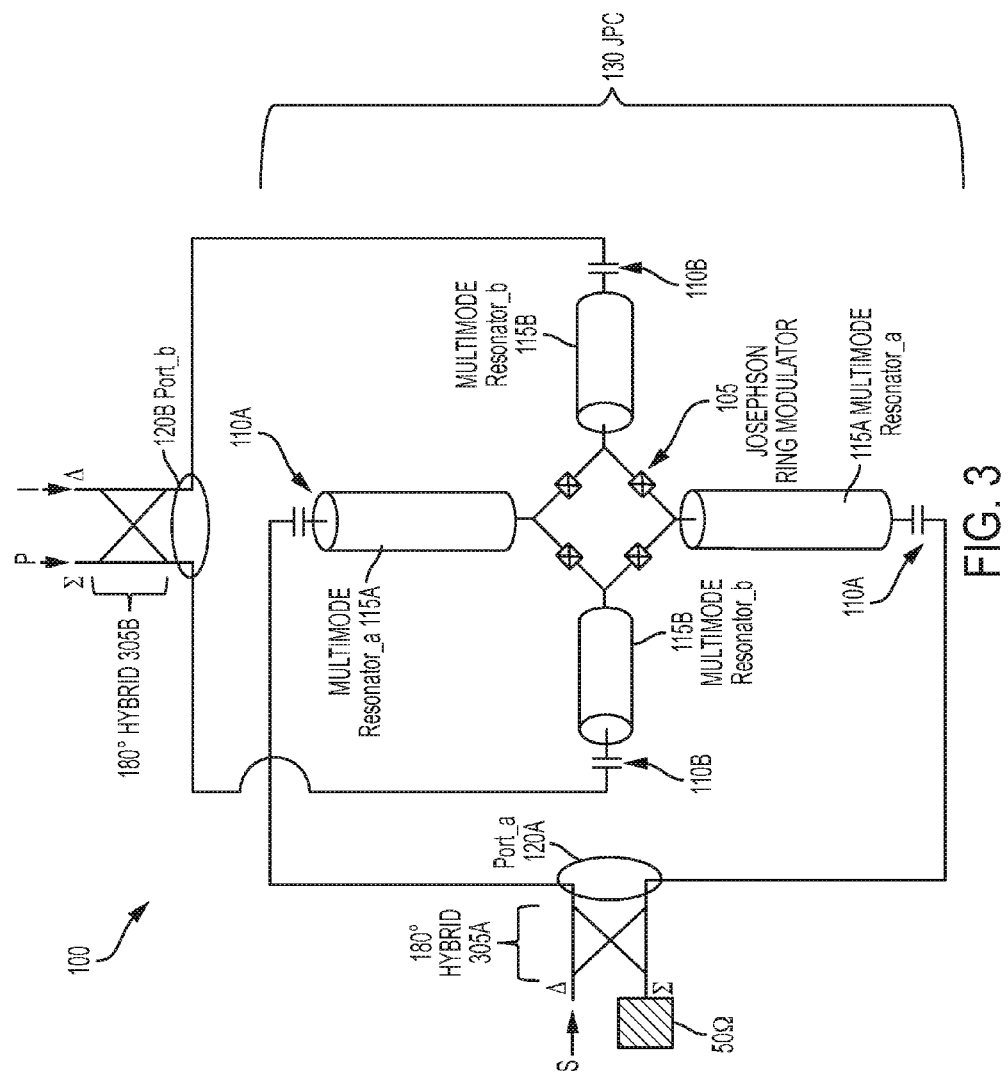
FIG. 3 is a schematic of the multimode Josephson parametric converter according to an embodiment.

FIG. 3 is a schematic of the multimode Josephson parametric converter 130 according to an embodiment. In FIG. 3, a 180° hybrid coupler 305A may be connected to port_a 120A and a 180° hybrid coupler 305B may be connected to port_b 120B.

A 180° hybrid is a 4-port microwave device which is reciprocal, matched, and ideally lossless. The 180° hybrid splits an input signal into two equal amplitude outputs. When fed from its sum port (Σ) the 180° hybrid provides two equal-amplitude in-phase output signals, whereas when fed from its difference port (Δ), it provides two equal-amplitude 180° out-of-phase output signals.

One scenario assumes that there is a Signal (S) tone that lies within the bandwidth of one of the resonance modes of the multimode microwave resonator_a which strongly couples to the JRM and is input through the Δ port of the 180° hybrid 305A, and the 50 ohm (Ω) termination is connected to the Σ port of the 180° hybrid 305A. It also assumes that there is an Idler (I) tone that lies within the bandwidth of one of the resonance modes of the multimode microwave resonator_b which strongly couples to the JRM and is input through the Δ port of the 180° hybrid 305B and a pump (P) tone input into the Σ port of the 180° hybrid 305B. Note that multiple pump tones at different frequencies may be utilized in order to feed the device.

The two main operation modes of the device are amplification mode (with photon gain) in which the applied pump frequency $f_P$ satisfies the relation $$f_P = f_I + f_S,$$

where $f_S$ and $f_I$ are the frequency of the Signal (S) and the Idler (I) tones respectively, and unitary frequency conversion mode (without photon gain) in which the applied pump frequency $f_P$ satisfies the relation $$f_P = |f_I - f_S|.$$

Different implementations of the quantum device with the multimode Josephson parametric converter 130 are discussed herein according to embodiments.

In contrast, to dual-differential-mode (standard nondegenerate) state-of-the-art Josephson parametric converters made of right-handed transmission lines, e.g., microstrip resonators, where the JRM is strongly couples to the two fundamental resonance modes of the two physical resonators of the device within the frequency band of interest, e.g. 5-15 GHz, the two multimode resonators of the multimode JPC 130, realized using metamaterial/left-handed transmission lines in embodiments (i.e., multimode resonator_a 115A and multimode resonator_b 115B), can be designed and engineered such that the JRM 105 strongly couples to multiple differential modes within the frequency band of interest. That is, each multimode resonator_a 115A and multimode resonator_b 115B has multiple resonance modes within the frequency band of interest, e.g. 5-15 GHz, many of which strongly couple to the JRM 105, as opposed to the state-of-the-art JPCs having (only) two fundamental differential resonance modes for its resonators within the band of interest which strongly couple to the JRM.

Multimode means that the multimode resonator_a 115A has multiple resonance modes and that the multimode resonator_b 115B has multiple resonance modes within a certain frequency band of interest, e.g. 5-15 GHz. This means that multimode resonator_a 115A is configured to resonate at multiple resonance frequencies from a first resonance frequency through a last resonance frequency within a certain frequency band of interest, which may include hundreds of resonance frequencies. Similarly, the multimode resonator_b 115B is configured to resonate at multiple resonance frequencies from a first resonance frequency through a last resonance frequency within a certain frequency band of interest, e.g. 5-15 GHz, which may include hundreds of resonance frequencies.

One notable property of the left-handed transmission lines/resonators (respectively implemented as multimode resonator_a 115A and multimode resonator_b 115B) is that they have a large density of modes (i.e., density of resonance modes) close to their low-frequency bound $\omega_{IR}$ making them multimode resonators in the frequency band of interest. For quantum measurements in superconducting devices, the band of interest is the microwave band of approximately 5-15 gigahertz (GHz) (commonly used for qubit readout and measurement). The multimode resonator_a 115A and multimode resonator_b 115B each can have a high density of resonance modes (i.e., harmonics or resonance frequencies) between approximately 5-15 GHz, which is beneficial for quantum measurements. In contrast, a right-handed transmission line (as a resonator) may have only one harmonic (one frequency resonance mode) at about 10 GHz and the next harmonic may be about 20 GHz (which is outside the 5-15 GHz microwave band of interest) in the state-of-the-art. Frequency resonance modes outside the 5-15 GHz microwave band of interest are not utilized to carry quantum information (mainly because most superconducting qubit frequencies fall within this range (i.e., fall within the band of interest), and many microwave generators, measuring devices, and microwave components are commercially available in this range), and therefore, multimode resonator_a 115A and multimode resonator_b 115B in embodiments may each have several tens or hundreds of frequency resonance modes (i.e., high density of modes) between 5-15 GHz which can be utilized to process quantum information using the multimode JPC 130.

In general, the density of modes of left-handed transmission line resonators at a given angular resonance frequency co is proportional to the number of units cells in the resonator and inversely proportional to the low-frequency bound $\omega_{IR}$.

It is to be noted that not all of the multiple resonance modes of multimode resonator_a and multimode resonator_b modes that fall within a certain band of interest, e.g., 5-15 GHz, strongly couple to the JRM at the center, i.e., have an RF-current antinode at the location of the JRM. Hence, the resonance modes which strongly couple to the JRM are a subset (approximately half) of the available resonance modes within the band of interest. Consequently, not all of the resonance modes of multimode resonator_a and multimode resonator_b that fall within the band of interest can be utilized in order to perform three-wave mixing, which forms the basis for the various quantum information processing operations enabled by this multimode device. In other words, the term multiple modes of multimode resonator_a and multimode resonator_b used in this disclosure mainly refers to those which strongly couple to JRM within the band of interest.

In one implementation, the multimode resonator_a 115A and multimode resonator_b 115B may each have between 5 to 20 frequency resonance modes in the range 5-10 GHz which strongly couple to the JRM. In another implementation, the multimode resonator_a 115A and multimode resonator_b 115B may each have between 20-50 frequency resonance modes in the range 5-10 GHz which strongly couple to the JRM. In yet another implementation, the multimode resonator_a 115A and multimode resonator_b 115B may each have 50-100 frequency resonance modes in the range 5-10 GHz which strongly couple to the JRM.

Since the multimode resonator_a 115A and multimode resonator_b 115B may each have multiple resonance modes which strongly couple to the JRM in the range 5-10 GHz (e.g. 5-100 frequency resonance modes), this allows the multimode JPC 130 to be useful in various intriguing applications in the area of quantum information processing beyond the capabilities of standard dual-differential mode JPCs, such as generation of remote entanglement between multiple qubits, generation of multiple pairs of entangled photons, amplification of multiple microwave signals at the quantum limit, and performing unitary frequency conversion between multiple propagating microwave signals at different frequencies.

Figure 4:
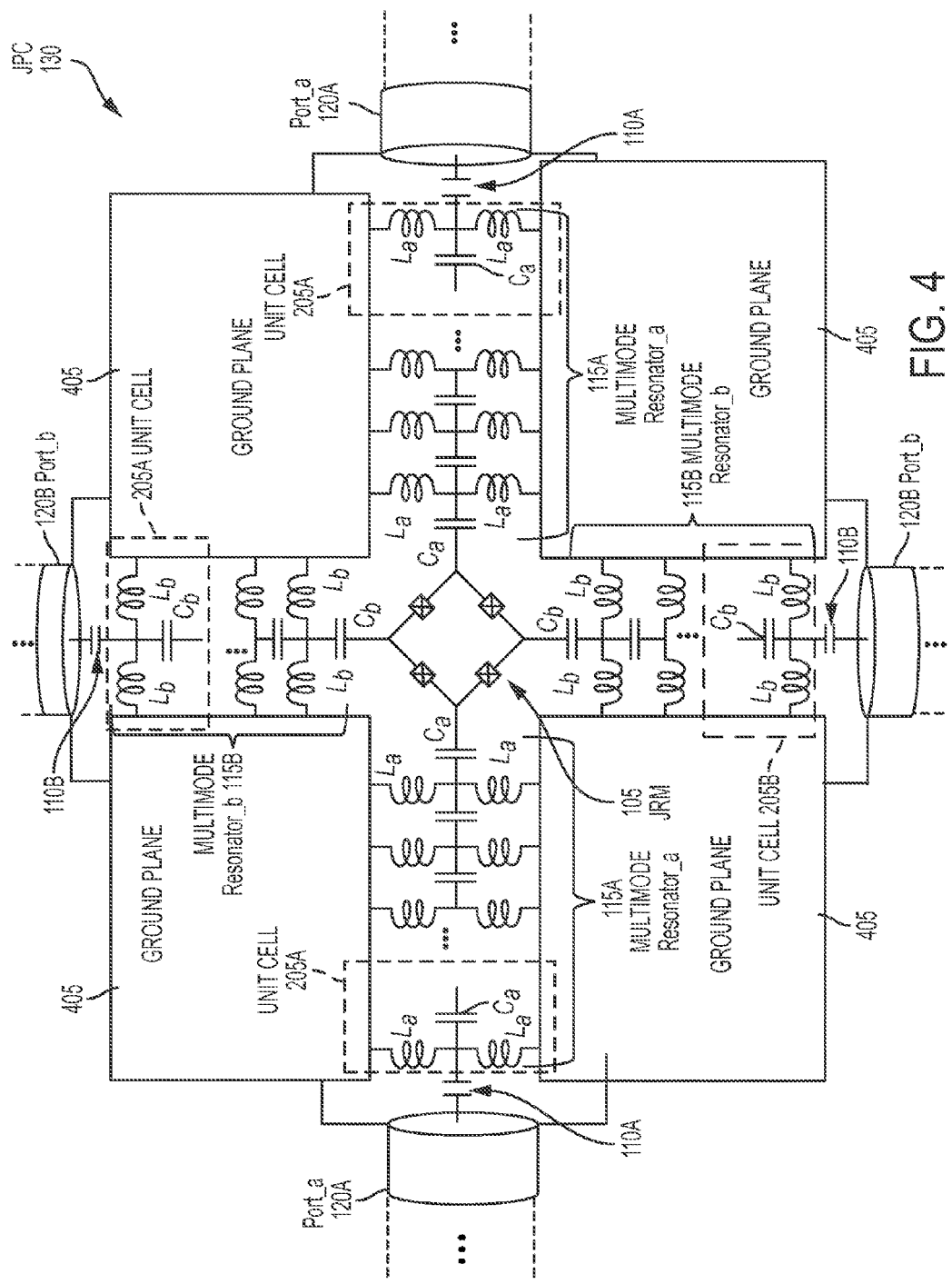
FIG. 4 is a coplanar waveguide implementation of the multimode Josephson parametric converter according to an embodiment.

FIG. 4 is an exemplary coplanar waveguide implementation of the multimode Josephson parametric converter 130 according to an embodiment.

The multimode JPC 130 includes multimode resonator_a 115A (left-handed transmission line) comprising lumped-element inductors $L_a$ (as the inductor $L_1$) and lumped-element capacitors $C_a$ (as the capacitors $C_1$). Similarly, the multimode JPC 130 includes multimode resonator_b 115B (left-handed transmission line) comprising lumped-element inductors $L_b$ (as the inductor $L_1$) and lumped-element capacitors $C_b$ (as the capacitors $C_1$).

The multimode resonator_a 115A (left-handed transmission line) is connected to the left and right nodes of the Josephson ring modulator 150. The multimode resonator_a 115A connects to port_a 120A. In the multimode resonator_a 115A, the unit cell 205A includes two inductors $L_a$ connected to the capacitor $C_a$. One end of the two inductors $L_a$ is connected to each other and the capacitor $C_a$, while the other end of the inductors $L_a$ is connected to the ground plane 405. This configuration of the unit cell 205A repeats N amount of times in the multimode resonator_a 115A as shown in FIG. 4. It should be noted that the use of two inductors in each unit cell is mainly for the purpose of keeping the device symmetric with regard to connection to ground. However, the use of one inductor connected to ground is also contemplated in one implementation.

The multimode resonator_b 115B (left-handed transmission line) is connected to the top and bottom nodes of the Josephson ring modulator 150. The multimode resonator_b 115B connects to port_b 120B. In the multimode resonator_b 115B, the unit cell 205B includes two inductors $L_b$ connected to the capacitor $C_b$. One end of the two inductors $L_b$ is connected to each other and the capacitor $C_b$, while the other end of the inductors $L_b$ is connected to the ground plane 405. In the multimode resonator_b 115B, this configuration of the unit cell 205B repeats M amount of times in the multimode resonator_b 115B as shown in FIG. 4. It should be noted that the use of two inductors in each unit cell is mainly for the purpose of keeping the device symmetric with regard to connection to ground. However, the use of one inductor connected to ground is also contemplated in an implementation.

As discussed in FIG. 2, the ports_a 115A and ports_b 115B may be fed using 180° hybrids 305A and 305B (not shown in FIG. 4). The ports_a 115A and ports_b 115B may be coaxial cables or coplanar waveguides or may be microstrips or striplines with a center conductor and outside conductor separated by a dielectric material. For ports_a 115A, the center conductor connects to the left and right sides of the multimode resonator_a 115A through coupling capacitors 110A, while the outside conductor is connected to the ground plane 405. For ports_b 115B, the center conductor connects to the top and bottom sides of the multimode resonator_b 115B through coupling capacitors 110B, while the outside conductor is connected to the ground plane 405.

Figure 5:
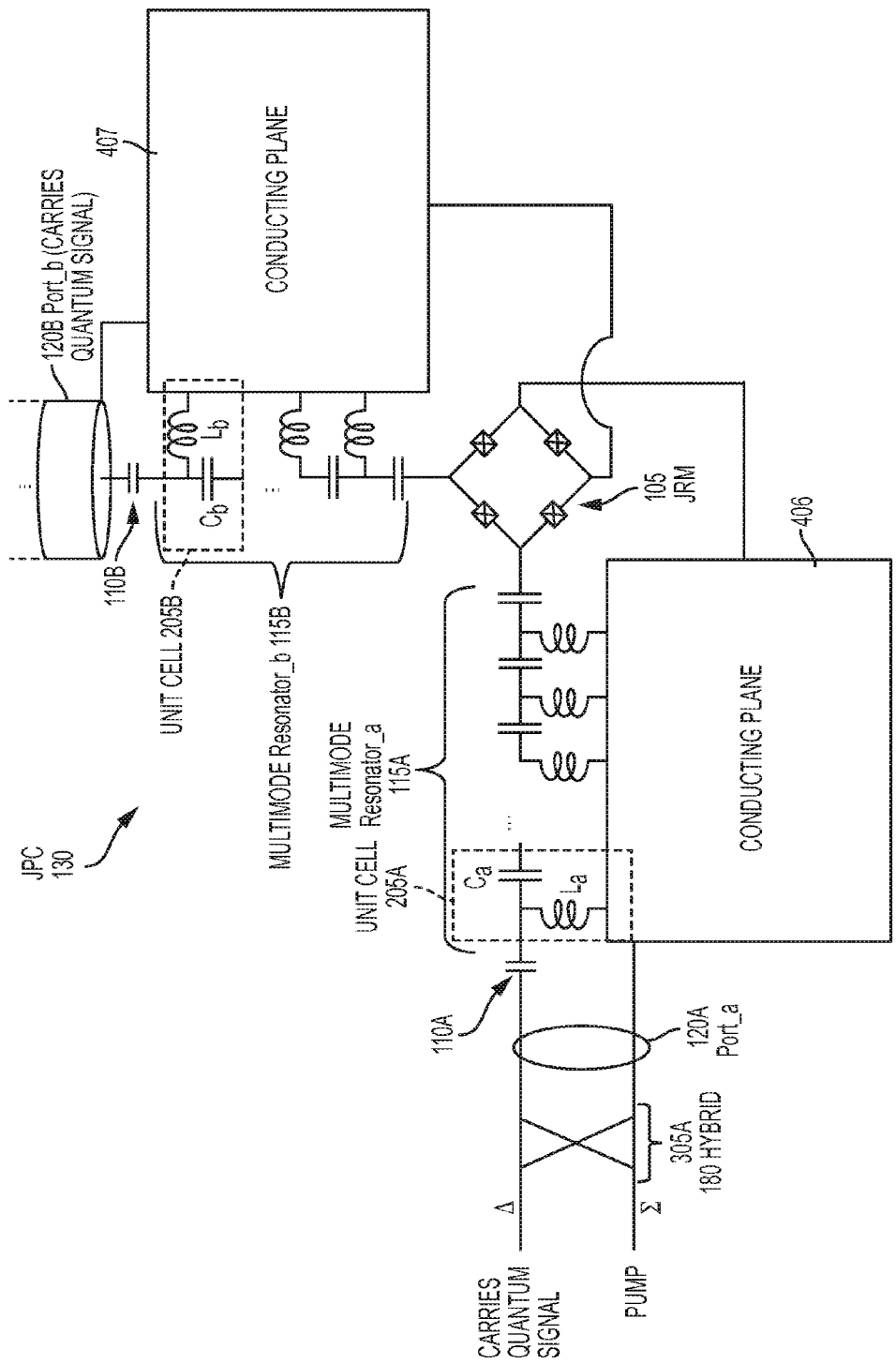
FIG. 5 is a semi-coplanar stripline implementation of the multimode Josephson parametric converter according to an embodiment.

FIG. 5 is an exemplary semi-coplanar stripline implementation of the multimode Josephson parametric converter 130 according to an embodiment.

The multimode JPC 130 includes multimode resonator_a 115A (left-handed transmission line) comprising inductor $L_a$ (as the inductor $L_1$) and capacitors $C_a$ (as the capacitors $C_1$). Similarly, the multimode JPC 130 includes multimode resonator_b 115B (left-handed transmission line) comprising inductors $L_b$ (as the inductor $L_1$) and capacitors $C_b$ (as the capacitors $C_1$).

The lumped-element side of the multimode resonator_a 115A is connected to the left node of the Josephson ring modulator 150, while the right node is connected to the conducting plane 406. The lumped-element side of the multimode resonator_a 115A and the conducting plane 406 connect to the 180 hybrid 305A. In the multimode resonator_a 115A, the unit cell 205A includes inductor $L_a$ connected to the capacitor $C_a$. One end of the inductor $L_a$ is connected to the capacitor $C_a$, while the other end of the inductor $L_a$ is connected to the conducting plane 406. This configuration of the unit cell 205A repeats N amount of times in the multimode resonator_a 115A as shown in FIG. 5. Although FIG. 5 illustrates the left node connected to the lumped-element side of the multimode resonator_a 115A and the right node connected to the conducting plane 406, this configuration can be interchanged such that the lumped-element side of the multimode resonator_a 115A is connected to the right node and the conducting plane 406 is connected to the left node.

The lumped-element side of the multimode resonator_b 115B is connected to the top node of the Josephson ring modulator 150, while the bottom node is connected to the conducting plane 407. The lumped-element side of the multimode resonator_b 115B and conducting plane 407 connect to the port_b 115B. In the multimode resonator_b 115B, the unit cell 205B includes inductor $L_b$ connected to the capacitor $C_b$. One end of the inductor $L_b$ is connected to the capacitor $C_b$, while the other end of the inductor $L_b$ is connected to the conducting plane 407. This configuration of the unit cell 205B repeats M amount of times in the multimode resonator_b 115B as shown in FIG. 5. Although FIG. 5 illustrates the top node connected to the lumped-element side of the multimode resonator_b 115B and the bottom node connected to the conducting plane 407, this configuration can be interchanged such that the lumped-element side of the multimode resonator_b 115B is connected to the top node and the conducting plane 407 is connected to the bottom node.

Figure 6:
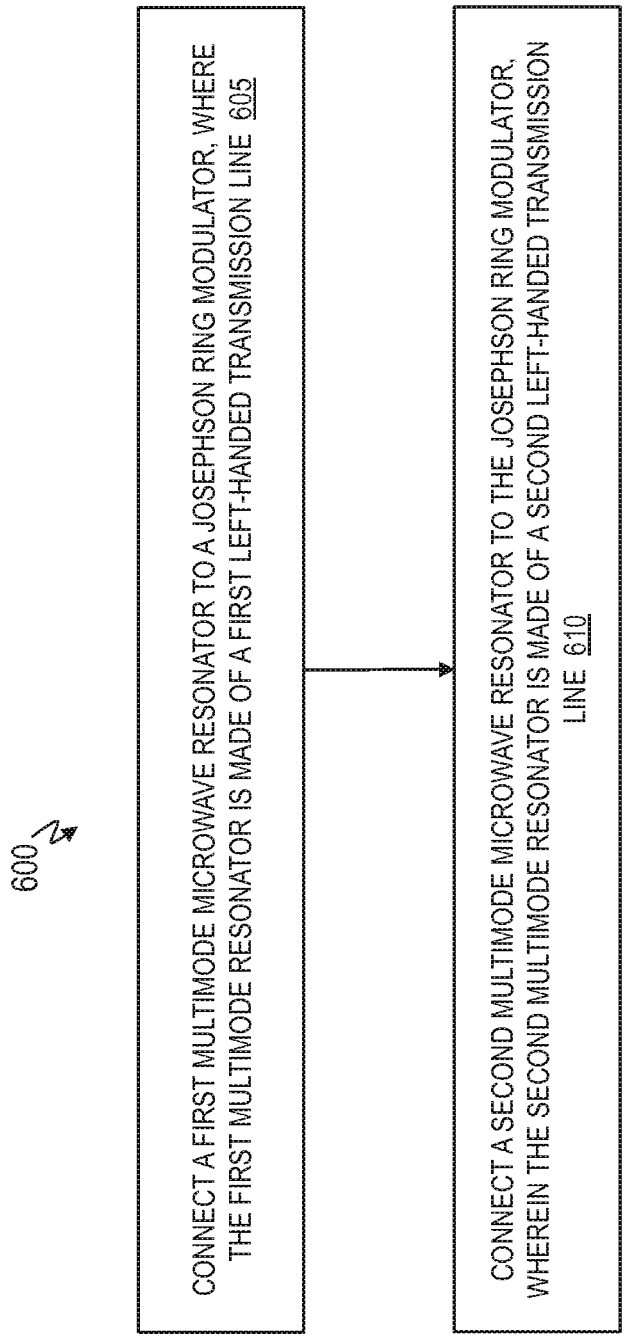
FIG. 6 is a method of configuring a microwave apparatus according to an embodiment.

FIG. 6 is a method of configuring a microwave apparatus (such as multimode JPC 130) according to an embodiment. Reference can be made to FIGS. 1-5.

At block 605, a first multimode resonator (i.e., multimode resonator_a 115A) is connected to a Josephson ring modulator 150, where the first multimode resonator is made of a first left-handed transmission line.

At block 610, a second multimode resonator (i.e., multimode resonator_b 115B) is connected to the Josephson ring modulator 150, where the second multimode resonator is made of a second left-handed transmission line.

The first multimode resonator (i.e., multimode resonator_a 115A) comprises a plurality of first resonance modes which strongly couple to the JRM within a certain frequency band of interest, and the second multimode resonator (i.e., multimode resonator_b 115B) comprises a plurality of second resonance modes which strongly couple to the JRM within the same frequency band of interest.

A number of the plurality of first resonance modes in the first multimode resonator which strongly couple to the JRM within a certain frequency band of interest is equal to a number of a plurality of second resonance modes in the second multimode resonator which strongly couple to the JRM within the same frequency band of interest. For example, the number of frequency resonance modes which strongly couple to the JRM within a certain frequency band of interest is equal in multimode resonator_a 115A and multimode resonator_b 115B.

The number of the plurality of first resonance modes in the first multimode resonator which strongly couple to the JRM within a certain frequency band of interest does not equal to the number of the plurality of second resonance modes in the second multimode resonator which strongly couple to the JRM within the same frequency band of interest. For example, the multimode resonator_a 115A or the multimode resonator_b 115B may have within a certain frequency band of interest more frequency resonance modes which strongly couple to the JRM than the other.

The first multimode resonator_a 115A comprises N amount of first unit cells 205A, and the second multimode resonator_b 115B comprises M amount of second unit cells 205B. Neither N nor M is equal to zero. In one implementation, N equals M, and in another implementation N does not equal M.

Each of the first unit cells 205A and each of the second unit cells 205B respectively comprises a capacitor ($C_a$, $C_b$) connected to one end of an inductor ($L_a$, $L_b$), while another end of the inductor ($L_a$, $L_b$) is connected to ground 405 or conducting planes 406, 407, as depicted is FIGS. 2, 4 and 5.

The Josephson ring modulator 150 comprises a first pair of nodes (e.g., left and right nodes JRM 150) opposite one another and a second pair of nodes (e.g., top and bottom nodes of the JRM 150) opposite one another. The first multimode resonator_a 115A is connected to the first pair of nodes. One of the first pair of nodes is connected to the lumped-element side of the resonator, and the conducting plane 406 is connected to another one of the first pair of nodes, as depicted in FIG. 5. The second multimode resonator_b 115B is connected to the second pair of nodes. One of the second pair of nodes is connected to the lumped-element side of the resonator and the conducting plane 407 is connected to another one of the second pair of nodes, as depicted in FIG. 5.

Each of the first unit cells 205A and each of the second unit cells 205B respectively comprises a first inductor (first $L_a$, first $L_b$), a second inductor (second $L_a$, second $L_b$), and a capacitor ($C_a$, $C_b$), as depicted in FIG. 4. The first ends of the first inductor and the second inductor are connected together, while second ends of the first inductor and the second inductor are connected to ground, and the capacitor is connected to the first ends, as depicted in FIG. 4.

The Josephson ring modulator 150 comprises a first pair of nodes opposite one another and a second pair of nodes opposite one another in a Wheatstone bridge. The first multimode resonator_a 115A is connected to the first pair of nodes, and the second multimode resonator_b 115B is connected to the second pair of nodes.

The first unit cells are connected to one another in series, and the second unit cells are connected to one another in series.

In one implementation, a capacitance and an inductance in each of the first unit cells 205 (in the multimode resonator_a 115A) are different from a capacitance and an inductance in each of the second unit cells (in the multimode resonator_b 115B). Since the unit cells 205A in the multimode resonator_a 115A are different from the unit cells 205B in the multimode resonator_b 115B, the multimode resonator_a 115A has different resonance modes and resonance frequencies than the multimode resonator_b 115B.

In another implementation, the capacitance and the inductance in each of the first unit cells (in the multimode resonator_a 115A) match the capacitance and the inductance in each of the second unit cells (in the multimode resonator_b 115B).

The lumped-element inductances and capacitances used in each multimode resonator can vary from one unit cell to another. Such perturbation to the periodic structure of the multimode resonator can be used in order to alter the frequency spacing between certain eigenmodes of the multimode resonator.

The lumped-element inductances used in the design of the left-handed transmission lines of the multimode resonators, e.g. $L_a$ and $L_b$, can be implemented using narrow superconducting wires in a meander configuration. The total inductance of the superconducting wire may be a combination of geometric and kinetic inductances. The lumped-element inductances used in the design of the left-handed transmission lines of the multimode resonators can also be implemented as an array of large Josephson Junctions.

The lumped-element capacitances used in the design of the left-handed transmission lines of the multimode resonators, e.g. $C_a$ and $C_b$, can be implemented as interdigitated capacitors or plate capacitors with a dielectric layer deposited between two electrodes along the center conductor of the left-handed transmission line.

It will be noted that various microelectronic device fabrication methods may be utilized to fabricate the components/elements discussed herein as understood by one skilled in the art. In superconducting and semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A microwave apparatus comprising:
    a Josephson ring modulator;
    a first multimode resonator connected to the Josephson ring modulator, wherein the first multimode resonator is made of a first left-handed transmission line, wherein the first multimode resonator fixedly comprises a plurality of first resonance modes that concurrently couple to the Josephson ring modulator within a certain frequency band; and
    a second multimode resonator connected to the Josephson ring modulator, wherein the second multimode resonator is made of a second left-handed transmission line.

2. The microwave apparatus of claim 1, wherein the second multimode resonator comprises a plurality of second resonance modes that couple to the Josephson ring modulator within the certain frequency band.

3. The microwave apparatus of claim 1, wherein a number of a plurality of first resonance modes in the first multimode resonator which couple to the Josephson ring modulator within the certain frequency band is equal to a number of a plurality of second resonance modes in the second multimode resonator which couple to the Josephson ring modulator within the certain frequency band; or
wherein the number of the plurality of first resonance modes in the first multimode resonator which couple to the Josephson ring modulator within a certain frequency band does not equal to the number of the plurality of second resonance modes in the second multimode resonator which couple to the Josephson ring modulator within the certain frequency band.

4. The microwave apparatus of claim 1, wherein the first multimode resonator comprises N amount of first unit cells;
wherein the second multimode resonator comprises M amount of second unit cells; and
wherein neither N nor M is equal to zero.

5. The microwave apparatus of claim 4, wherein each of the first unit cells and each of the second unit cells comprises a capacitor connected to one end of an inductor, while another end of the inductor is connected to a ground plane or conducting plane.

6. The microwave apparatus of claim 5, wherein the Josephson ring modulator comprises a first pair of nodes opposite one another and a second pair of nodes opposite one another;
wherein the first multimode resonator is connected to the first pair of nodes; and
wherein the second multimode resonator is connected to the second pair of nodes.

7. The microwave apparatus of claim 4, wherein each of the first unit cells and each of the second unit cells comprises a first inductor, a second inductor, and a capacitor;
wherein first ends of the first inductor and the second inductor are connected together, while second ends of the first inductor and the second inductor are connected to ground; and
wherein the capacitor is connected to the first ends.

8. The microwave apparatus of claim 4, wherein N equals M.

9. The microwave apparatus of claim 4, wherein N does not equal M.

10. The microwave apparatus of claim 4, wherein the first unit cells are connected to one another in series; and
wherein the second unit cells are connected to one another in series.

11. The microwave apparatus of claim 4, wherein a capacitance and an inductance in the first multimode resonator varies from one unit cell to another in the first unit cells, thereby altering frequency spacing between certain eigenmodes of the first multimode resonator; and
wherein a capacitance and an inductance in the second multimode resonator varies from one unit cell to another in the second unit cells, thereby altering frequency spacing between certain eigenmodes of the second multimode resonator.

12. The microwave apparatus of claim 4, wherein a capacitance and an inductance in each of the first unit cells is different from a capacitance and an inductance in each of the second unit cells.

13. The microwave apparatus of claim 4, wherein a capacitance and an inductance in each of the first unit cells match a capacitance and an inductance in each of the second unit cells.

14. A microwave apparatus comprising:
a Josephson ring modulator in a Wheatstone bridge configuration, the Josephson ring modulator comprising a first pair of nodes opposite one another and a second pair of nodes opposite one another;
a first multimode resonator connected to the Josephson ring modulator, wherein the first multimode resonator is a first left-handed transmission line, the first multimode resonator being connected to the first pair of nodes, wherein the first multimode resonator comprises first unit cells, and, wherein the first multimode resonator fixedly comprises a plurality of first resonance modes that concurrently couple to the Josephson ring modulator within a certain frequency band;
a second multimode resonator connected to the Josephson ring modulator, wherein the second multimode resonator is a second left-handed transmission line, the second multimode resonator being connected to the second pair of nodes, and wherein the second multimode resonator comprises second unit cells; and
a ground plane connected to inductors respectively in the first unit cells and the second unit cells, wherein capacitors connect to another end of the inductors respectively in the first unit cells and the second unit cells.

15. A microwave apparatus comprising:
a Josephson ring modulator in a Wheatstone bridge configuration, the Josephson ring modulator comprising a first pair of nodes opposite one another and a second pair of nodes opposite one another;
a first multimode resonator connected to the Josephson ring modulator, wherein the first multimode resonator is a first left-handed transmission line, a lumped-element side of the first multimode resonator being connected to one node in the first pair of nodes and a conducting plane being connected to another node in the first pair of nodes, wherein the first multimode resonator comprises first unit cells, and, wherein the first multimode resonator fixedly comprises a plurality of first resonance modes that concurrently couple to the Josephson ring modulator within a certain frequency band; and
a second multimode resonator connected to the Josephson ring modulator, wherein the second multimode resonator is a second left-handed transmission line, a lumped-element side of the second multimode resonator being connected to one node in the second pair of nodes and a conducting plane being connected to another node in the second pair of nodes, and wherein the second multimode resonator comprises second unit cells.

* * * * *